(12) United States Patent
Lee et al.

(10) Patent No.: US 9,024,522 B2
(45) Date of Patent: May 5, 2015

(54) ORGANIC LIGHT EMITTING DIODE DISPLAY HAVING DISPLAY SUBSTRATE WITH REDUCED THICKNESS

(71) Applicants: Sang-Hee Lee, Yongin (KR); Hwan-Jin Kim, Yongin (KR)

(72) Inventors: Sang-Hee Lee, Yongin (KR); Hwan-Jin Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 6 days.

(21) Appl. No.: 13/956,672

(22) Filed: Aug. 1, 2013

(65) Prior Publication Data

US 2014/0252944 A1   Sep. 11, 2014

(30) Foreign Application Priority Data

Mar. 7, 2013   (KR) .......................... 10-2013-0024699

(51) Int. Cl.
*H05B 33/00*   (2006.01)
*H05B 33/12*   (2006.01)
*H01L 51/56*   (2006.01)
*H01L 27/32*   (2006.01)

(52) U.S. Cl.
CPC ................ *H05B 33/12* (2013.01); *H01L 51/56* (2013.01); *H01L 27/32* (2013.01)

(58) Field of Classification Search
USPC .................................. 313/504, 506, 498, 512
See application file for complete search history.

(56) References Cited

FOREIGN PATENT DOCUMENTS

| KR | 10-2009-0055410 A | 6/2009 |
|---|---|---|
| KR | 10-2010-0051292 A | 5/2010 |
| KR | 10-2011-0025288 A | 3/2011 |

*Primary Examiner* — Joseph L Williams
(74) *Attorney, Agent, or Firm* — Lee & Morse, P.C.

(57) ABSTRACT

An organic light emitting diode (OLED) display includes a lower substrate having a display area displaying an image and a non-display area formed along an edge of the display area, the display area having a first thickness, at least a part of the non-display area having a second thickness that is greater than the first thickness; and a protection member disposed at the lower side of the lower substrate, the protection member being disposed in the display area of the lower substrate.

10 Claims, 4 Drawing Sheets

ORGANIC LIGHT EMITTING DIODE DISPLAY HAVING DISPLAY SUBSTRATE WITH REDUCED THICKNESS

CROSS-REFERENCE TO RELATED APPLICATION

This application claims priority to and the benefit of Korean Patent Application No. 10-2013-0024699, filed in the Korean Intellectual Property Office on Mar. 7, 2013, the entire contents of which are incorporated herein by reference.

BACKGROUND

1. Field

Embodiments relate to an organic light emitting diode (OLED) display.

2. Description of the Related Art

An organic light emitting diode display may include organic light emitting elements constituted by a hole injection electrode, an organic emission layer, and an electron injection electrode. The organic light emitting element may emit light by energy generated when an exciton generated by combining an electron and a hole in the organic emission layer falls from an exited state to a lower state, and the organic light emitting diode display may display a predetermined image by using this light emission. An organic light emitting diode display may have a self-luminance characteristic such that a separate light source is not required, unlike a liquid crystal display. Thus, a thickness and a weight of the organic light emitting diode display may be reduced. Further, since the organic light emitting diode display may exhibit desirable characteristics such as low power consumption, high luminance, and rapid response speed, the organic light emitting diode display is of interest as a next generation display.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting diode (OLED) display, including a lower substrate having a display area displaying an image and a non-display area formed along an edge of the display area, the display area having a first thickness, at least a part of the non-display area having a second thickness that is greater than the first thickness; and a protection member disposed at the lower side of the lower substrate, the protection member being disposed in the display area of the lower substrate.

In the lower side of the lower substrate, the lower substrate may have an inclined or curved interface between a portion formed with the first thickness and a portion formed with the second thickness.

One end of the protection member may be adjacent to a portion where the inclination or the curve starts in the interface.

The protection member may have a size that is equal to or smaller than the display area of the lower substrate.

The protection member may have a third thickness, and the sum of the first thickness and the third thickness may be equal to or greater than the second thickness.

Embodiments are also directed to an organic light emitting diode (OLED) display, including a window; a lower substrate disposed at a lower side of the window, and including a display area and a non-display area; a protection member disposed in the display area of the lower substrate; and a reinforcement member disposed in the shape of a plate and disposed at a lower side of the lower substrate, the reinforcement member supporting a portion of the lower substrate that corresponds to the non-display area.

The protection member may have a size that is equal to or smaller than the display area of the lower substrate.

The protection member may have a third thickness, the reinforcement member may have a fourth thickness, and the third thickness may be equal to or greater than the fourth thickness.

The reinforcement member may be made of an aluminum alloy or stainless steel.

The reinforcement member may be extended to support the lower side of the window.

BRIEF DESCRIPTION OF THE DRAWINGS

Features will become apparent to those of skill in the art by describing in detail example embodiments with reference to the attached drawings in which.

DETAILED DESCRIPTION

Figure 1:
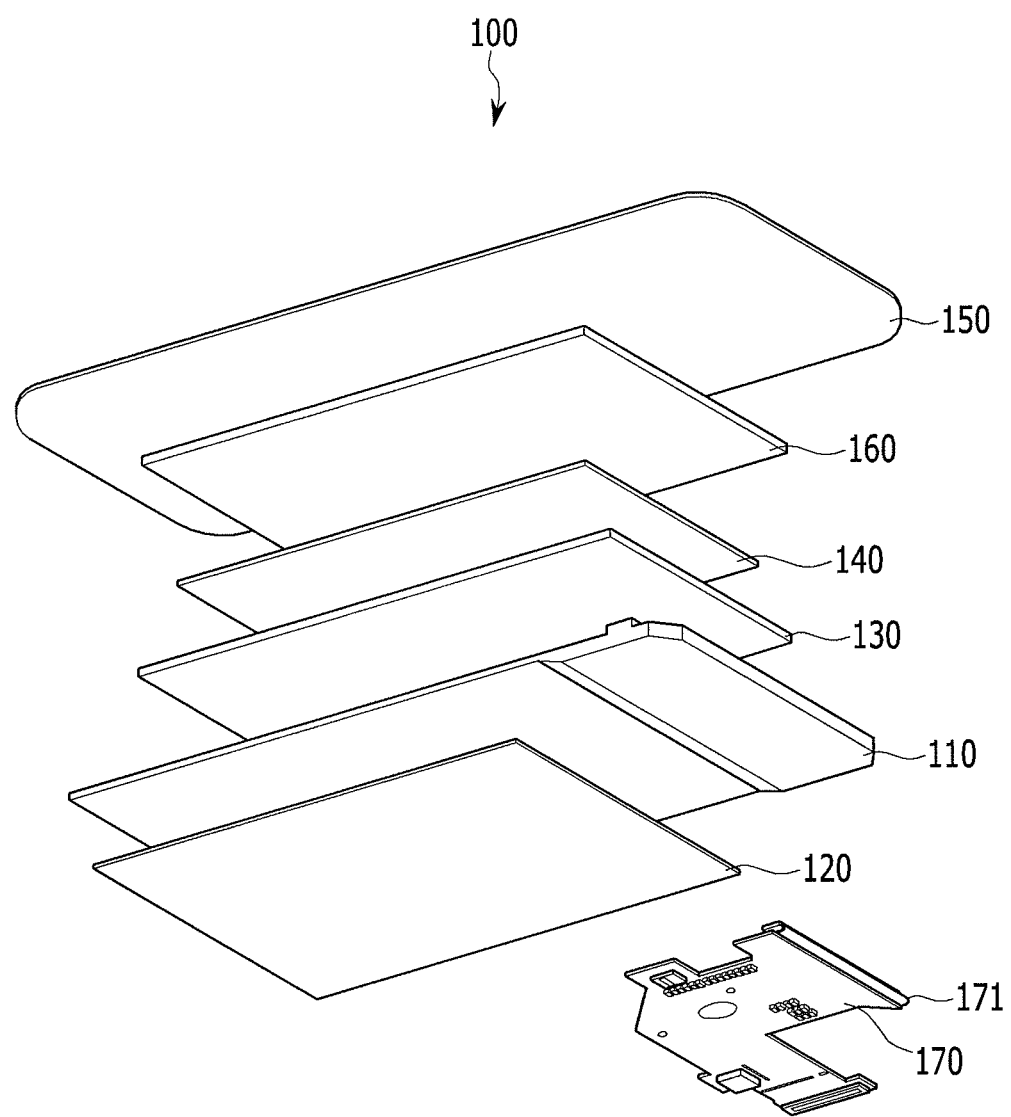
FIG. 1 is an exploded perspective view of an OLED display according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. In the drawing figures, dimensions may be exaggerated for clarity of illustration. Like reference numerals refer to like elements throughout.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

An entire structure of an organic light emitting diode (OLED) display according to an example embodiment will now be described.

Figure 2:
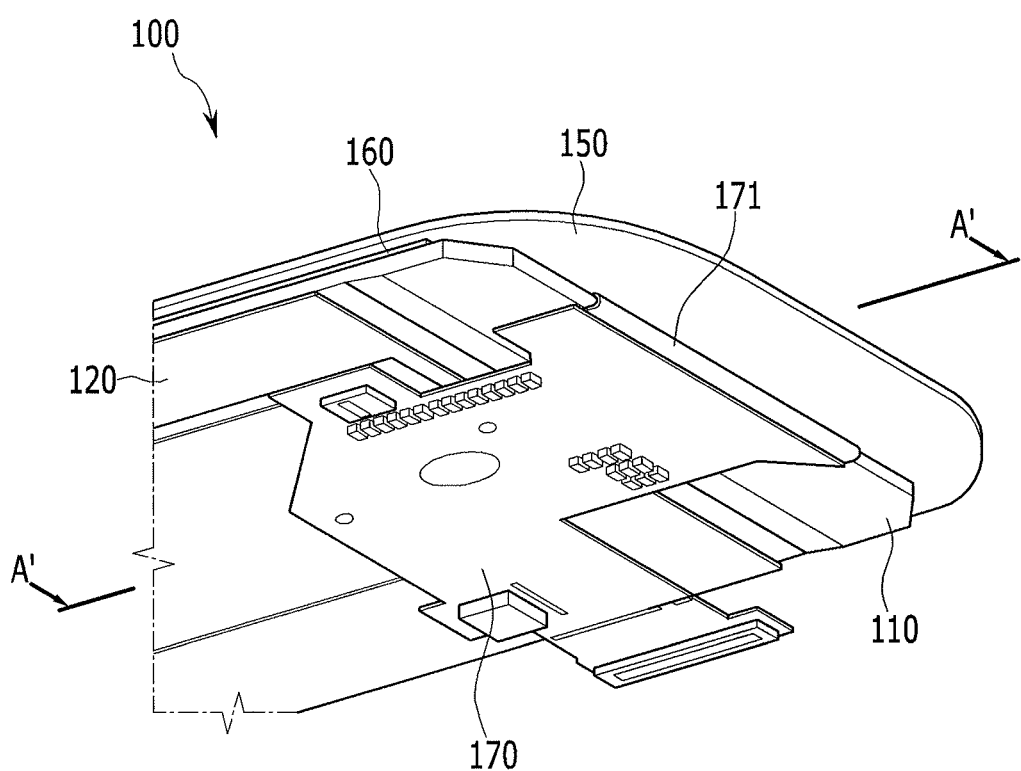
FIG. 2 is a perspective view of a part of the OLED display shown in FIG. 1.
Figure 3:
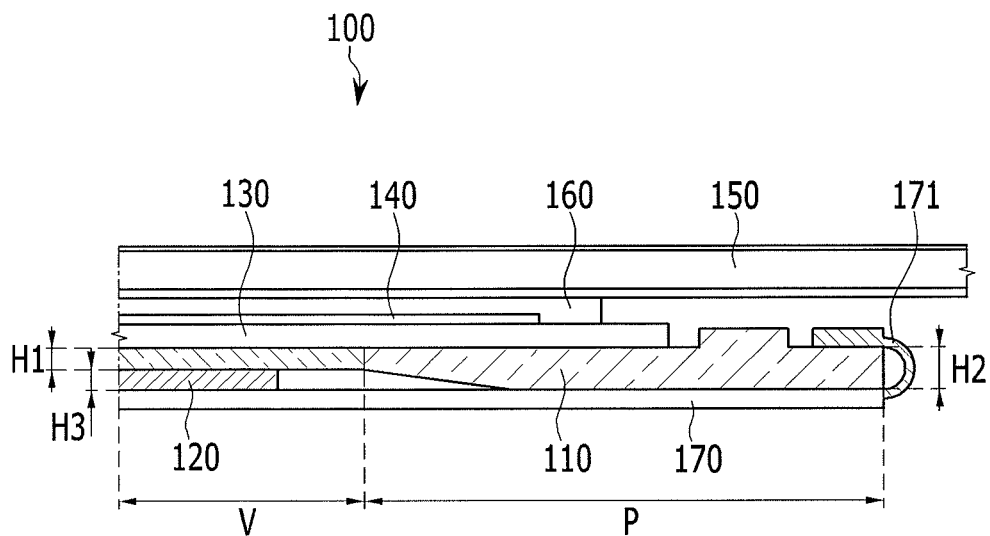
FIG. 3 is cross-sectional view of the OLED display of FIG. 2, taken along the line A-A'.

FIG. 1 is an exploded perspective view of an OLED display according to an example embodiment, FIG. 2 is a perspective view of a part of the OLED display according to the example embodiment of FIG. 1, and FIG. 3 is a cross-sectional view of the OLED display of FIG. 2, taken along the line A-A'.

Referring to FIG. 1 to FIG. 3, an OLED display 100 according to the example embodiment may include a lower substrate 110, a protection member 120, an upper substrate 130, a plurality of organic light emitting elements (not shown), a polarizer 140, a window 150, an adhesive layer 160, and a main board 170.

In the present example embodiment, the lower substrate 110 includes a display area V and a non-display area P. The display area V outputs an image. The non-display area P is formed along the edges of the display area V. The plurality of pixels may be arranged in a matrix format in the display area V. A scan driver (not shown) and a data driver (not shown) may be provided between the display area A and a sealant (not shown) or in an external side of the sealant in order to drive pixels.

In addition, pad electrodes (not shown) may be provided in the display area V of the lower substrate 110 to transmit electric signals to the scan driver and the data driver.

When the OLED display 100 according to the example embodiment is a low temperature polycrystalline silicon (LTPS) type OLED display, the lower substrate 110 may be formed as a LTPS glass.

In the present example embodiment, the protection member 120 is disposed in a lower side of the lower substrate 110. The protection member 120 prevents external impact from being transmitted to the lower substrate 110. The protection member 120 may be disposed in the display area V in the lower substrate 110. Such a protection member 120 may be made of a sponge material. On the other hand, the protection member 120 may be formed of a black tape.

The upper substrate 130 may be disposed on the lower substrate 110. The upper substrate 130 may be bonded to the lower substrate 110 by the sealant while forming a predetermined gap therebetween. The upper substrate 130 encapsulates driving circuits (not shown) and organic light emitting elements (not shown) formed at the lower substrate 110. The upper substrate 130 may be made of various materials including glass or plastic.

In the present example embodiment, the main board 170 is disposed at a lower side of the protection member 120. A flexible printed circuit film 171 may be disposed at one side of the main board 170. The flexible printed circuit film 171 may be installed on the lower substrate 110 by a chip on glass (COG) method. The main board 170 transmits a control signal to the organic light emitting elements formed with a pattern on the lower substrate 110.

The plurality of organic light emitting elements (not shown) are disposed between the lower substrate 110 and the upper substrate 130, and may be formed in the display area V of the lower substrate 110.

The polarizer 140 may be disposed on the upper substrate 130. The polarizer 140 aligns a direction of light passing therethrough.

The window 150 may be disposed on the polarizer 140. The window 150 may be formed of glass or acryl having excellent light transmitting characteristic. The window 150 enables an image output by the organic light emitting elements to be displayed to the outside.

The adhesive layer 160 is disposed between the polarizer 140 and the window 150. The adhesive layer 160 may be, for example, an optically clear adhesive (OCA).

The upper substrate 130, the plurality of organic light emitting elements, the polarizer 140, the window 150, and the adhesive layer 160 may be the same as those in a general OLED display.

In the OLED display 100 having a structure according to the present example embodiment, the protection member 120 may be disposed in the display area V in the lower substrate 110. Thus, the protection member 120 may be disposed in the display area V and may not be disposed in the non-display area P. In further detail, the protection member 120 may be the same as the display area V of the lower substrate 110 or smaller than the display area V in size. In an implementation, the display area V of the lower substrate 110 has a first thickness H1, and at least a part of the non-display area P of the lower substrate 110 has a second thickness H2 that is greater than (thicker) than the first thickness H1.

As described above, the structure in which the protection member 120 is disposed only in the display area V enables the entire thickness of the OLED display 100 to be reduced as much as the thickness of the protection member 120 compared to a structure in which the protection member 120 is disposed not only in the display area V but also in the non-display area P.

Further, since the non-display area P where the protection member 120 is not disposed is relatively thicker than the display area V where the protection member 120 is formed, the strength of a portion that corresponds to the non-display area P in the lower substrate 110 may be improved. Thus, in the OLED display 100 according to the present example embodiment, the OLED display 100 may be made slim by reducing the entire thickness thereof while improving impact resistance by improving strength of the lower substrate 110.

In the lower substrate 110, the display area V may have the first thickness H1 and the thickness of the non-display area P may have the second thickness when the OLED display 100 is manufactured using, for example, an etching process. During a manufacturing process of the OLED display according to the present example embodiment, the etching process may be used. The thickness of the display area V and the thickness of the non-display area P may be formed to be different from each other by increasing the etching time for the display area V to be longer than the etching time for the non-display area P. However, the method for differentiating the thickness of the display area and the non-display area in the lower substrate is not limited to the etching method.

The interface of the portion formed with the first thickness H1 and the portion formed with the second thickness H2 in the lower side of the lower substrate 110 may be inclined. In another implementation, the interface of the portion formed with the first thickness H1 and the portion formed with the second thickness H2 in the lower side of the lower substrate 110 may be curved.

With such a structure, when the external impact is applied to the OLED display 100 according to the example embodiment, resistance to a stress generated in the interface of the portion formed with the first thickness H1 and the portion formed with the second thickness H2 in the lower side of the lower substrate 110 may be improved, thereby helping to prevent damage to the lower substrate 110.

Further, when the interface of the portion formed with the first thickness H1 and the portion formed with the second thickness H2 in the lower side of the lower substrate 110 is inclined or curved, the protection member 120 may be disposed to be adjacent to a portion where the inclination or the curve starts in the interface at one side thereof.

The protection member 120 may have has a third thickness H3, and the sum of the first thickness H1 and the third thickness 113 may be equivalent to or greater than the second thickness H2.

On the other hand, if the sum of the first thickness H1 and the third thickness H3 is smaller than the second thickness H2, the main board 170 may not be tightly bonded to the protection member 120, thereby generating a gap therebetween. Thus, the impact transmitted to the main board 170 may be directly transmitted to the lower substrate 110 so that the lower substrate 110 may be damaged.

However, according to the present example embodiment, the sum of the first thickness H1 and the third thickness H3 is equivalent to or greater than the second thickness H2 so that the main board 170 may be tightly bonded to the protection member 120. Accordingly, when the impact is transmitted to the main board 170, the impact may not be directly transmitted to the lower substrate 110, thereby helping to prevent the lower substrate 110 from being damaged.

Figure 4:
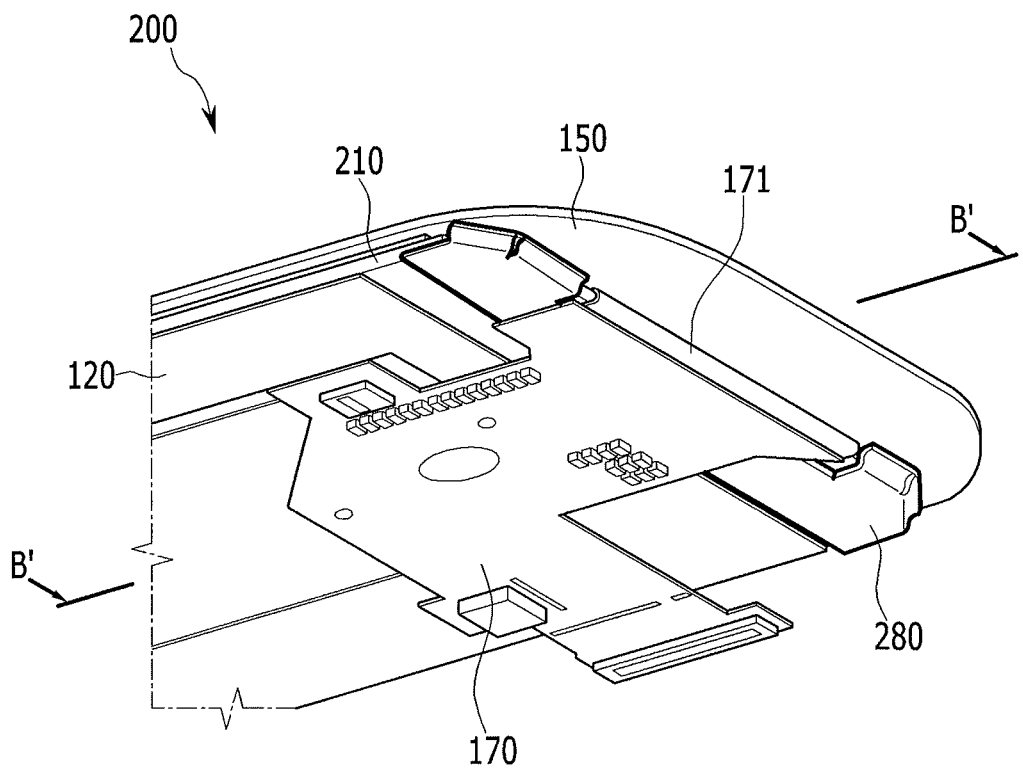
FIG. 4 is a perspective view partially illustrating an OLED display according to another example embodiment.
Figure 5:
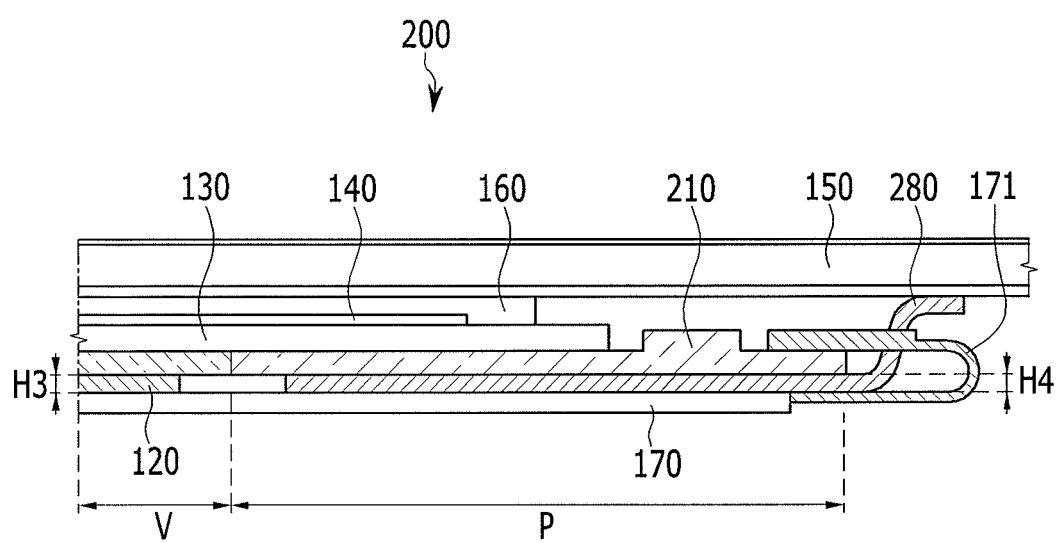
FIG. 5 is a cross-sectional view of the OLED display of FIG. 4, taken along the line B-B'.

FIG. 4 is a perspective view that partially illustrates an OLED display according to another example embodiment, and FIG. 5 is a cross-sectional view of the OLED display of FIG. 4, taken along the line B-B'.

Referring to FIG. 4 and referring to FIG. 5, an OLED display 200 according to the present example embodiment includes the window 150, the lower substrate 210, the protection member 120, the upper substrate 130, the plurality of organic light emitting elements, the polarizer 140, the adhesive layer 160, and a reinforcing member 280.

Here, the protection member 120, the window 150, the upper substrate 130, the plurality of organic light emitting elements (not shown), the polarizer 140 and the adhesive layer 160 are described in the previous example embodiment.

The lower substrate 210 is disposed at a lower side of the window 150, and includes a display area V and a non-display area P. Unlike the OLED display 100 (refer to FIG. 2) of the previous example embodiment, the display area V and the non-display area P of the lower substrate 210 included in the OLED display 200 according to the present example embodiment have the same thickness.

The reinforcing member 280 is formed in the shape of a plate and supports a portion that corresponds to the non-display area P at the lower side of the lower substrate 210. The reinforcing member 280 may be made of a metal. The reinforcing member 280 may be made of an aluminum alloy or stainless steel.

Such a reinforcing member 280 may be manufactured individually from the lower substrate 210 and then may be coupled to the lower substrate 210 or the window 150. On the other hand, the reinforcing member 280 may be made of plastic, and may be formed by injection molding.

The entire thickness of the OLED display 200 may be reduced as much as the thickness of the protection member 120, not with a structure in which the protection member 280 is disposed in the display area V as well as in the non-display area P, but with a structure in which the protection member 280 is disposed only in the display area V.

In addition, the OLED display 100 according to the previous example embodiment uses a process for forming the non-display area P to be thick in the lower substrate 110 (refer to FIG. 2). However, the OLED display 200 according to the present example embodiment may be manufactured without having a process for individually processing the areas of the lower substrate 210. Accordingly, a manufacturing cost in manufacturing of the OLED display 200 may be reduced.

Further, the lower substrate 210 in the OLED display 200 according to the present example embodiment may be formed of glass or a transparent film. In the OLED display 200 according to the present example embodiment, the reinforcement member 280 that is relatively stronger than glass or a film is disposed in the lower side of the lower substrate 210 so that impact resistance may be further significantly improved compared to a general OLED display that does not include such a reinforcement member.

Thus, the entire thickness of the OLED display 200 according to the present example embodiment may be slim, and at the same time the reinforcement member 280 may improve strength of the lower substrate 210 so that resistance with respect to external impact may be significantly improved.

One side of the reinforcing member 280 may be extended to support the lower side of the window 150. In further detail, one side of the reinforcement member 280 may be extended from the circumference thereof, disposed adjacent to the external edge of the lower substrate 110 so as to contact the lower side of the window 150. With such a structure, external force transmitted to the reinforcement member 280 may be dispersed to the window 150 and the protection member 120, and accordingly the external force may be prevented from being transmitted to the lower substrate 210, thereby helping prevent the lower substrate 210 from being damaged due to the external force.

The protection member 120 may have a third thickness H3 and the reinforcing member 280 may have a fourth thickness H4. In this case, the third thickness may be equal to or greater than the fourth thickness. If the fourth thickness H4 of the reinforcing member 280 is greater than the third thickness H3 of the protection member 120, the entire thickness of the OLED display 200 may be increased.

In the OLED display 200 according to the present example embodiment, the thickness of the reinforcing member 280 is equal to or smaller than the thickness of the protection member 120 so that the OLED display 200 may be made slim. Particularly, when the fourth thickness H4 of the reinforcing member 280 is equal to the third thickness H3 of protection member 120, the upper side of the main board 170 may be wholly bonded to the reinforcing member 280 and the protection member 120 so that external impact transmitted to the main board 170 may be dispersed to the reinforcing member 280 and the protection member 120, thereby helping to prevent the OLED display 200 from being damaged.

By way of summation and review, mobile devices are being made increasingly thin, and thus an OLED display mounted to a mobile device should be thin. A panel assembly included in such an OLED display may be formed of two thin substrates. Unlike a liquid crystal display, in which a panel assembly may be filled with liquid crystal, the panel assembly of the OLED display may have therein an empty space, which may make the panel assembly relatively weak against impacts from being dropped. Therefore, making the OLED display slim only by reducing the thickness of members forming the panel assembly thereof may result in weakness.

As described above, embodiments may provide an organic light emitting diode (OLED) display that may be made slim while having improved impact resistance. According to an embodiments, a protection member is disposed on a display area of the display member so that the entire thickness of the OLED display may be reduced as much as the thickness of the protection member, compared to a structure in which the protection member is disposed not only in the display area but also in the non-display area. Further, the non-display area where the protection member is not disposed may be relatively thicker than the display area where the protection member is formed, and therefore the strength of a portion corresponding to the non-display area in the lower substrate may be improved. Thus, according to embodiments, the OLED display may be made slim by reducing the entire thickness of the OLED display and impact resistance may be improved by improving the strength of the lower substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

| <Description of symbols> | |
|---|---|
| 100, 200: OLED display | 110, 210: lower substrate |
| 120: protection member | 130: upper substrate |
| 140: polarizer | 150: window |
| 160: adhesive layer | 170: main board |
| 280: reinforcing member | H1: first thickness |
| H2: second thickness | H3: third thickness |
| H4: fourth thickness | |

What is claimed is:

1. An organic light emitting diode (OLED) display, comprising:
 a lower substrate having a display area displaying an image and a non-display area formed along an edge of the display area, the display area having a first thickness, at least a part of the non-display area having a second thickness that is greater than the first thickness; and
 a protection member disposed at the lower side of the lower substrate, the protection member being disposed in the display area of the lower substrate.

2. The OLED display of claim 1, wherein, in the lower side of the lower substrate, the lower substrate has an inclined or curved interface between a portion formed with the first thickness and a portion formed with the second thickness.

3. The OLED display of claim 2, wherein one end of the protection member is adjacent to a portion where the inclination or the curve starts in the interface.

4. The OLED display of claim 1, wherein the protection member has a size that is equal to or smaller than the display area of the lower substrate.

5. The OLED display of claim 1, wherein the protection member has a third thickness, and the sum of the first thickness and the third thickness is equal to or greater than the second thickness.

6. An organic light emitting diode (OLED) display, comprising:
 a window;
 a lower substrate disposed at a lower side of the window, and including a display area and a non-display area;
 a protection member disposed in the display area of the lower substrate; and
 a reinforcement member disposed in the shape of a plate and disposed at a lower side of the lower substrate, the reinforcement member supporting a portion of the lower substrate that corresponds to the non-display area.

7. The OLED display of claim 6, wherein the protection member has a size that is equal to or smaller than the display area of the lower substrate.

8. The OLED display of claim 6, wherein the protection member has a first thickness, the reinforcement member has a second thickness, and the first thickness is equal to or greater than the second thickness.

9. The OLED display of claim 6, wherein the reinforcement member is made of an aluminum alloy or stainless steel.

10. The OLED display of claim 6, wherein the reinforcement member is extended to support the lower side of the window.

* * * * *